(12) United States Patent
Liu

(10) Patent No.: US 7,156,157 B2
(45) Date of Patent: Jan. 2, 2007

(54) COOLING MECHANISM

(75) Inventor: Wen-Hao Liu, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 0 days.

(21) Appl. No.: 11/069,452

(22) Filed: Mar. 2, 2005

(65) Prior Publication Data
US 2006/0196636 A1 Sep. 7, 2006

(51) Int. Cl.
H05K 7/20 (2006.01)

(52) U.S. Cl. .................. 165/80.3; 165/121; 361/697

(58) Field of Classification Search ............ 165/80.3, 165/121, 185; 361/697
See application file for complete search history.

(56) References Cited

U.S. PATENT DOCUMENTS

| 3,727,114 | A | * | 4/1973 | Oshima | .............. | 257/726 |
| 6,538,888 | B1 | * | 3/2003 | Wei et al. | .............. | 361/697 |
| 2001/0014011 | A1 | * | 8/2001 | Sasa et al. | .............. | 361/704 |
| 2004/0108104 | A1 | * | 6/2004 | Luo | .............. | 165/181 |
| 2004/0190257 | A1 | * | 9/2004 | Chang | .............. | 361/703 |
| 2004/0196632 | A1 | * | 10/2004 | Chen et al. | .............. | 361/697 |
| 2005/0088821 | A1 | * | 4/2005 | Lee et al. | .............. | 361/697 |
| 2005/0161196 | A1 | * | 7/2005 | Hsieh | .............. | 165/80.3 |
| 2005/0189088 | A1 | * | 9/2005 | Wang et al. | .............. | 165/80.3 |
| 2005/0237718 | A1 | * | 10/2005 | Lee et al. | .............. | 361/697 |

\* cited by examiner

Primary Examiner—Allen J. Flanigan

(57) ABSTRACT

A cooling mechanism according to the present invention comprises a heat conductive unit having a plurality of heat radiating fins extended outward in the radial direction thereof and a fan. The heat radiating fins and the air gaps among the heat radiating fins define a circular attachment face, on which the fan is attached. The fan further comprises a fan bracket and a fan wheel mounted within the fan bracket. The fan wheel further includes a wheel hub and a plurality of blades arranged around the wheel hub. The radial distance over which the blades of the fan extend significantly exceeds the outer rim of the attachment face of the heat conductive unit, so that air flow driven by the fan can pass through the air gaps of the heat conductive unit as well as the outer wall of the rim of the heat conductive unit.

5 Claims, 5 Drawing Sheets

COOLING MECHANISM

FIELD OF THE INVENTION

The present invention relates to cooling mechanisms, more particularly to a cooling mechanism with a fan mounted on the top of a heat conductive unit and larger than the heat conductive unit.

BACKGROUND OF THE INVENTION

Since the operational clock of electronic elements and chips has been increasing rapidly in recent years, the heat resource on a circuit board of a computer is not limited to a central processing unit (CPU); the circuit elements around the CPU, such as capacitors, induction coils and north/south bridge chips, would contribute significantly to the heat generation due to the upgrade of power and processing speed therein. However, the major computer manufacturers have concentrated on the cooling problem of only CPUs, whereas the cooling of the peripheral elements has been largely ignored. Without effectively cooling the peripheral elements, the performance of the CPU will be influenced, and the lifespan of the CPU will even be shortened.

Restricted to the space limit, the conventional cooling mechanism is an electric fan mounted on a heat conductive unit with a plurality of heat radiating fins. The combination is then attached to a heat generating source on a circuit board. The heat in the source is conducted away by the heat conductive unit and then carried away by air flow drive by the fan through the fins. The present invention aims at upgrading the cooling function of a cooling mechanism whereby not only a CPU can get cooled but also the circuit elements around the CPU. The heat radiating device and the flow guiding unit therein disclosed by R.O.C. patent number 527089 comprises a flow guiding tube with a front opening and a rear opening that is smaller than the front opening. The interior portion of the flow guiding tube is provided with a plurality of flow guiding fins. The front opening is connected to the wind exit of a fan, and the rear opening is connected to the heat radiating fins, whereby the air will be driven by the fan and enter the tube from the front opening to the rear opening; the air flow thereby formed will carry heat away from the heat radiating fins within the tube.

However, the cooling mechanism of the prior art can only change the flow rate passing through the tube, and it cannot cool the peripheral circuit elements around the CUP to which the cooling mechanism is attached. Further, the hot air exhausted form the cooling mechanism would diffuses toward the peripheral elements and causes a temperature rise therein. This would shorten the lifespan of the peripheral circuit elements. It is a further disadvantage of the cooling mechanism that there often exists a small gap between the flow guiding tube and the heat radiating unit due to imperfect connection, and therefore the operation of the fan, which is mounted on the tube and of a size substantially larger than the tube, would cause vibration of the tube against the heat radiating unit and produce noises thereon. Moreover, the installation of the flow guiding tube causes an extra production procedure and the associated labor cost. It is a further disadvantage that the conic topology of the flow guide tube of the cooling mechanism would easily cause noises as the air flow hit the converging inner wall of the tube and backward sub-flow of the air that reduces the heat exchange efficiency.

The heat radiating hood disclosed by R.O.C. patent number M240780 comprises a hollow hood body disposed on a computer mother board. The hood body has a top face whereon two opposite sides thereof are connected to at least a sidewall. The lower side of the hood body is open. The combined portion of the top face and the sidewall has one end closed and the other end open and connected to a wind generator. Thereby, the hood body may cover a mother board, confine all of the heat produced by the circuit elements on the mother board and then draw the heat out of the computer by the wind generator.

The latter cooling mechanism of the prior art includes the cooling of all elements it covers. However, this cooling mechanism is complicated to install in a computer and will cause large noises within the hood body. Further, as the number of circuit elements being enclosed increases, the air flow in the hood will experience a larger air drag, therefore reducing the cooling efficiency.

SUMMARY OF THE INVENTION

Accordingly, the primary objective of the present invention is to provide a cooling mechanism wherein a fan is mounted on a smaller heat conductive unit.

The secondary objective of the present invention is to provide a cooling mechanism wherein the air passage is enlarged in the radial direction for effectively cooling the heat conductive unit and the device connected beneath the heat conductive unit.

It is a further objective of the present invention that the air flow for cooling is enhanced without upgrading the motor and the structure of the fan, thereby upgrading the cooling efficiency.

Further, the present invention provides a cooling mechanism economizing the use of electricity and building materials, thereby reducing its production cost.

To achieve the above objectives, a cooling mechanism according to the present invention comprises a heat conductive unit having a plurality of heat radiating fins extended outward in the radial direction thereof and a fan. Between two adjacent heat radiating fins exists an air gap. The heat radiating fins and the corresponding air gaps define a circular attachment face, on which the fan is attached. The fan further comprises a fan bracket and a fan wheel. The fan wheel, mounted on a hub mount, further includes a wheel hub and a plurality of blades arranged around the wheel hub. The main feature of the present invention is that the radial distance over which the blades of the fan extend significantly exceeds the outer rim of the attachment face of the heat conductive unit, and the air passage defined by the fan bracket is larger than the sweeping area of the blades, whereby the fan wheel can pivotally mounted within the fan bracket. Because of the difference in area, the air passage extends over the attachment face so that air flow driven by the fan can pass through the outer wall of the rim of the heat conductive unit.

The various objects and advantages of the present invention will be more readily understood from the following detailed description when read in conjunction with the appended drawings.

DETAILED DESCRIPTION OF THE PREFERRED EMBODIMENTS

Figure 1:
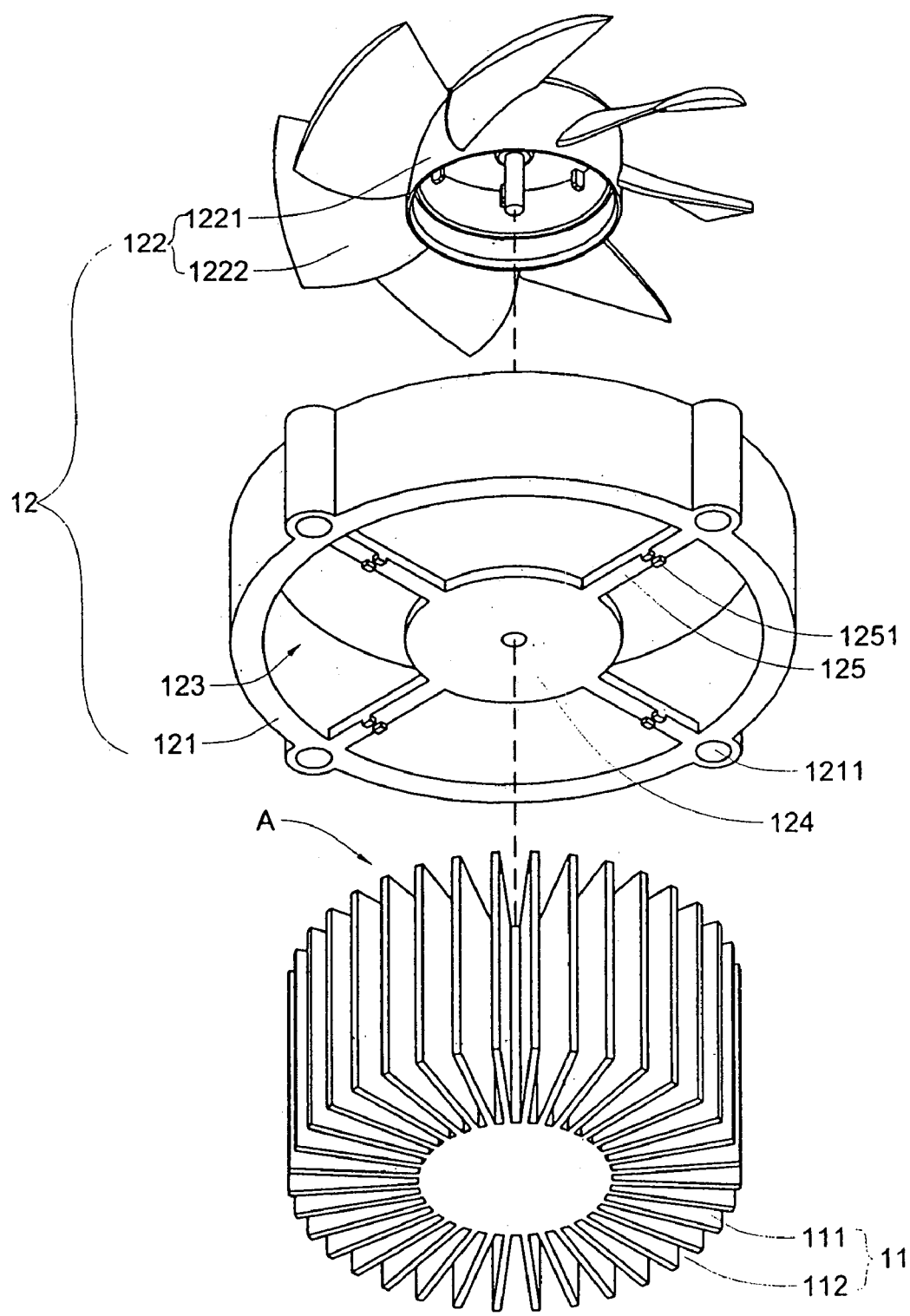
FIG. 1 is an exploded perspective view of the first preferred embodiment of the present invention as a cooling mechanism.
Figure 2:
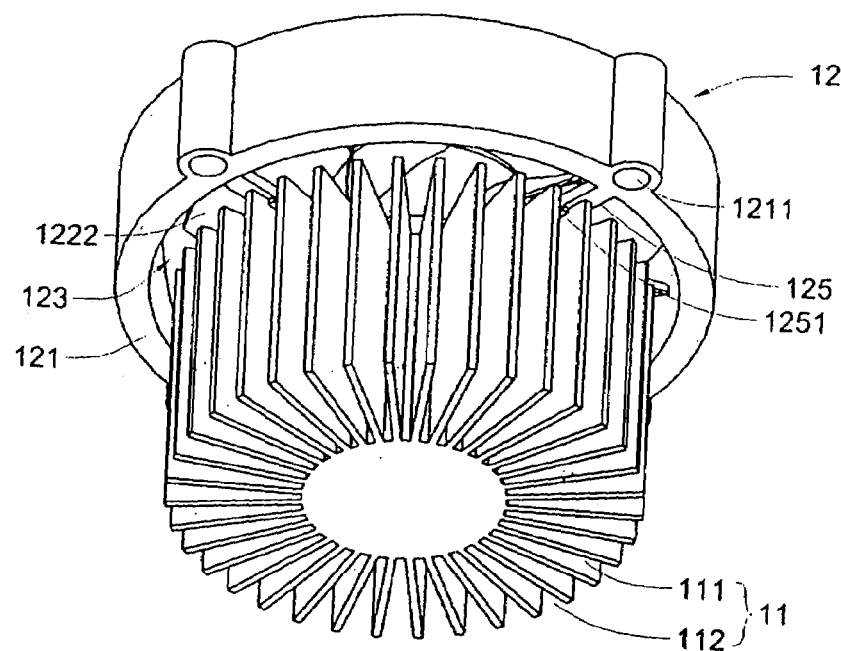
FIG. 2 is a perspective view of the first preferred embodiment of the present invention.
Figure 3:
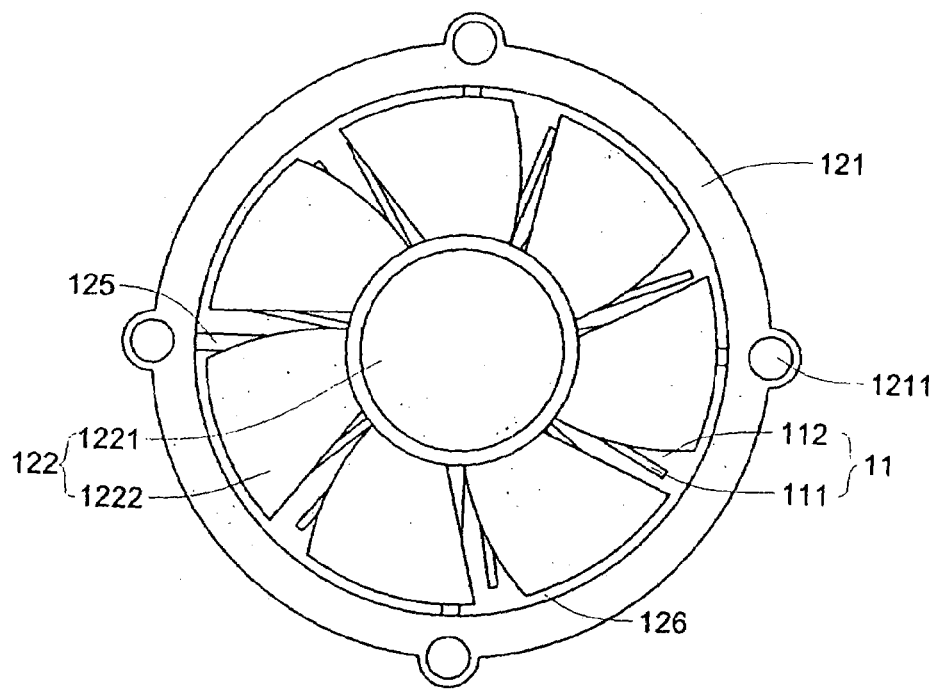
FIG. 3 is a top view of the first preferred embodiment of the present invention.

Referring to FIGS. 1 to 3, a cooling mechanism according to the present invention comprises a cylindrical heat conductive unit 11 having a plurality of heat radiating fins 111 extended outward in the radial direction thereof and a fan 12. Between two adjacent heat radiating fins 111 exists an air gap 112. The heat radiating fins 111 and the corresponding air gaps 112 define a circular attachment face A, on which the fan 12 is attached. The fan 12 further comprises a fan bracket 121 and a fan wheel 122. The rim of the fan bracket 121 is provided with a plurality of through holes 1211 for the insertion of securing pieces 16. The inner space of the fan bracket 121 defines an air passage 123, the center of which is provided with a hub mount 124 connected to the inner wall of the fan bracket 121 through a plurality of connecting beams 125. The fan wheel 122, mounted on the hub mount 124, further includes a wheel hub 1221 and a plurality of blades 1222 arranged around the wheel hub 1221.

In this preferred embodiment, the bottom faces of the connecting beams 125 are respectively provided with retaining pieces 1251 for engaging some of the heat radiating fins 111 of the heat conductive unit 11. Thereby, the attachment of the fan 12 on the heat conductive unit 11 is further enhanced. The main feature of the present invention is that the radial distance over which the blades 1222 of the fan 12 extend significantly exceeds the outer rim of the attachment face A of the heat conductive unit 11, and the cross section area of the air passage 123 defined by the fan bracket 121 is also larger than the sweeping area of the blades 1222, whereby the fan wheel 122 can pivotally mounted within the fan bracket 121. Because of the difference in area, the air passage 123 extends over the attachment face A to form a radial outer spacing 126, as shown in FIG. 3.

Figure 4:
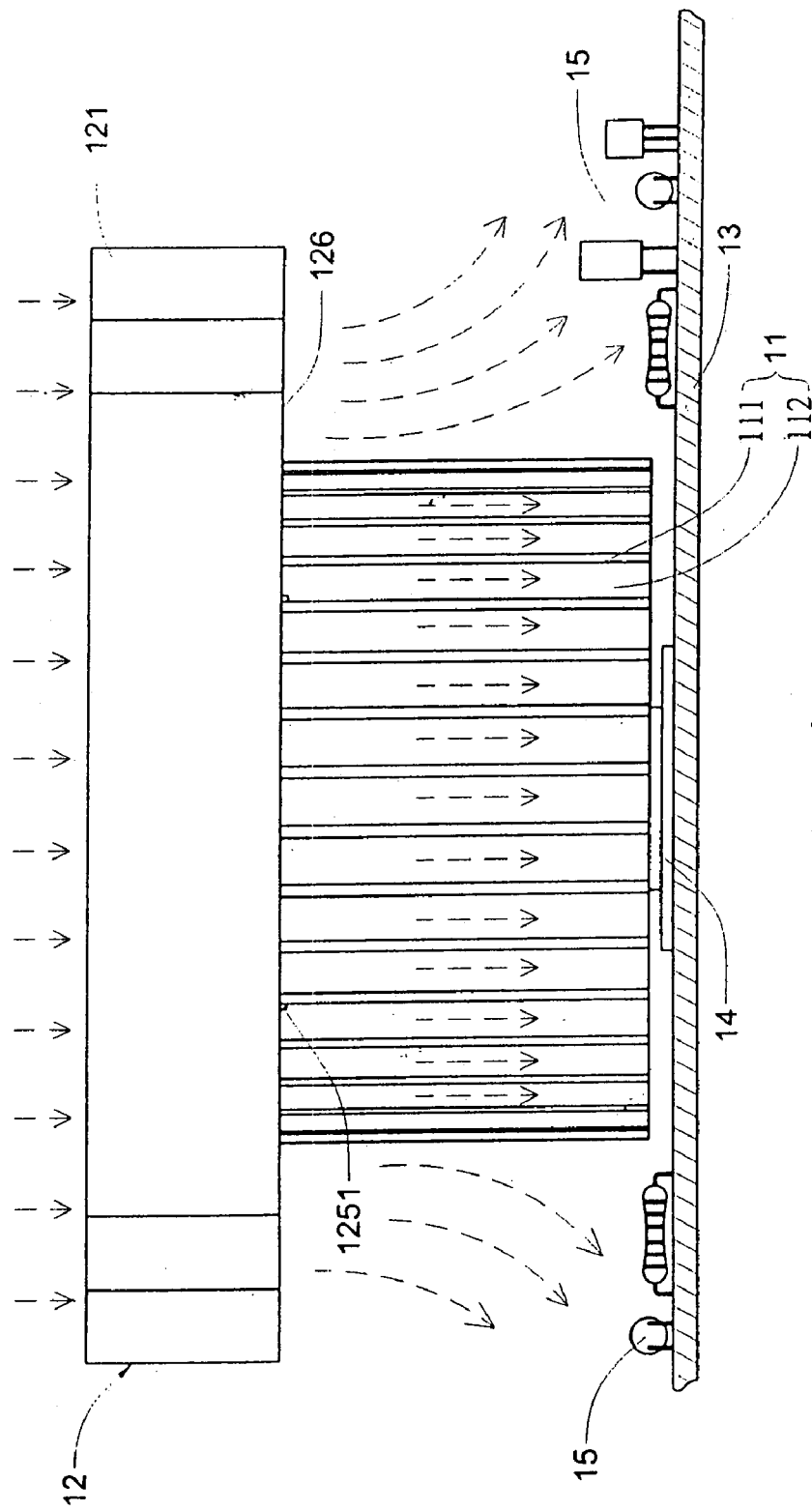
FIG. 4 is a side cross-sectional view of the first preferred embodiment of the present invention mounted on a base.

Refer to FIG. 4 for an illustration of this preferred embodiment used with a heat generating device. The cooling mechanism is mounted on a base 13 whereon a primary circuit element 14 (such as a central processing unit (CPU)) and a plurality of secondary circuit elements 15 (such as capacitors, induction coils and north/south bridge chips) are located. The heat conductive unit 11 is attached tightly on the primary circuit element 14 for carrying away the heat the primary circuit element 14 is generating by heat conduction. The heat transported to the heat conductive unit 11 is then taken away by air flow driven by the fan 12 and passing through the air gaps 112 between the heat radiating fins 111. Therefore, the fan 12 cools the primary circuit element 14 indirectly. Since the air passage 123 of the fan 12 is larger than the attachment face A of the heat conductive unit 11, extra air flow passes through the radial outer spacing 126 (defined by the air passage 123 subtracted by the attachment face A) and can cool the secondary circuit elements 15 distributed around the primary circuit element 14. Further, the cooling mechanism can enhance the air circulation around the heat conductive unit 11 so that the heated air passing through the air passage 123 will not stay around the secondary circuit elements 15, which may extend the lifespan of the secondary circuit elements 15 and may reduce the maintenance cost.

Therefore, the present invention as illustrated by the first preferred embodiment enhances the cooling efficiency without upgrading the motor and the structure of the fan, which economizes the use of electricity and building materials and reduces the production cost of such cooling mechanisms.

Figure 5:
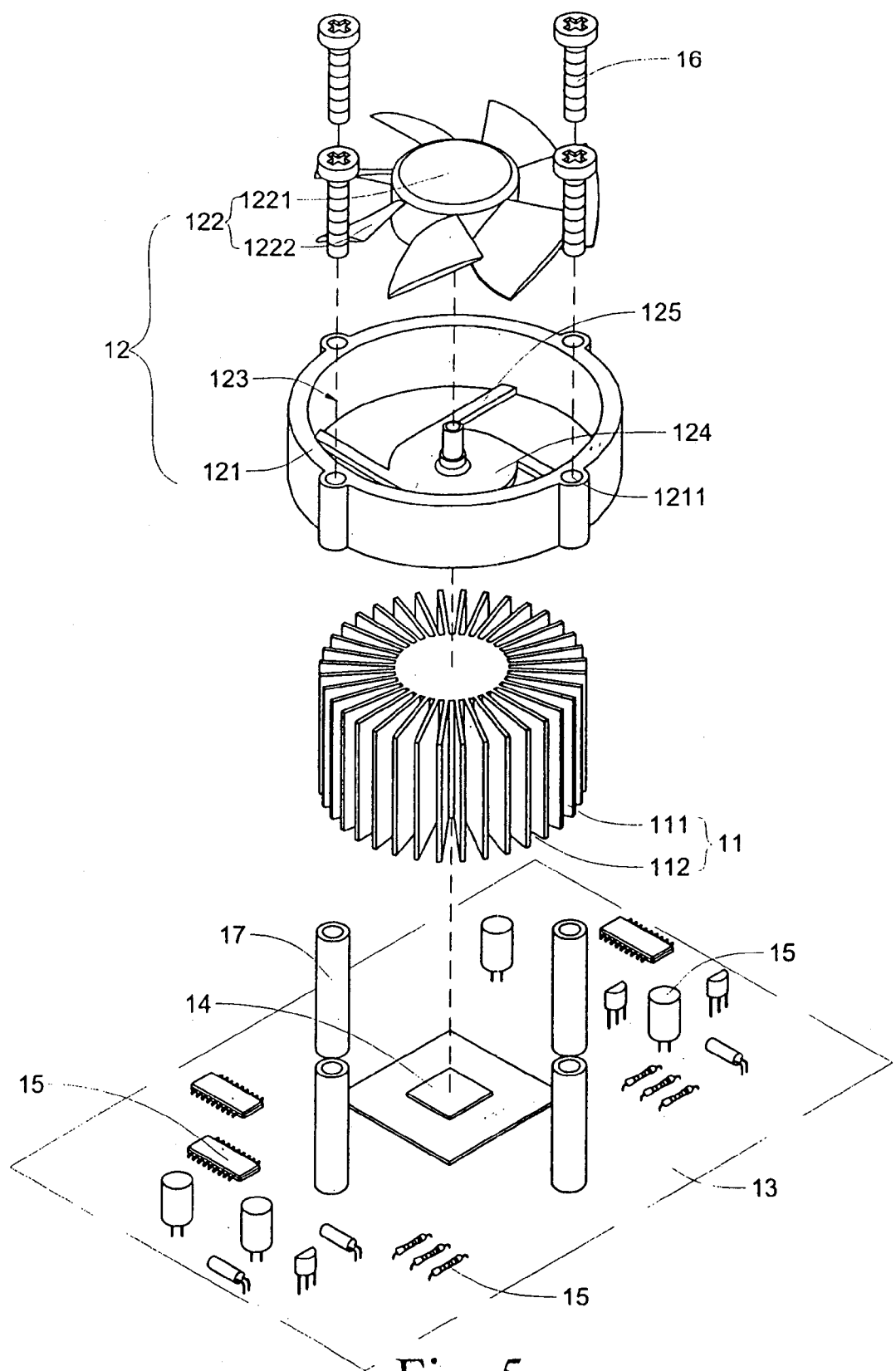
FIG. 5 is an exploded perspective view of the second preferred embodiment of the present invention mounted on a base by a different connecting mechanism.
Figure 6:
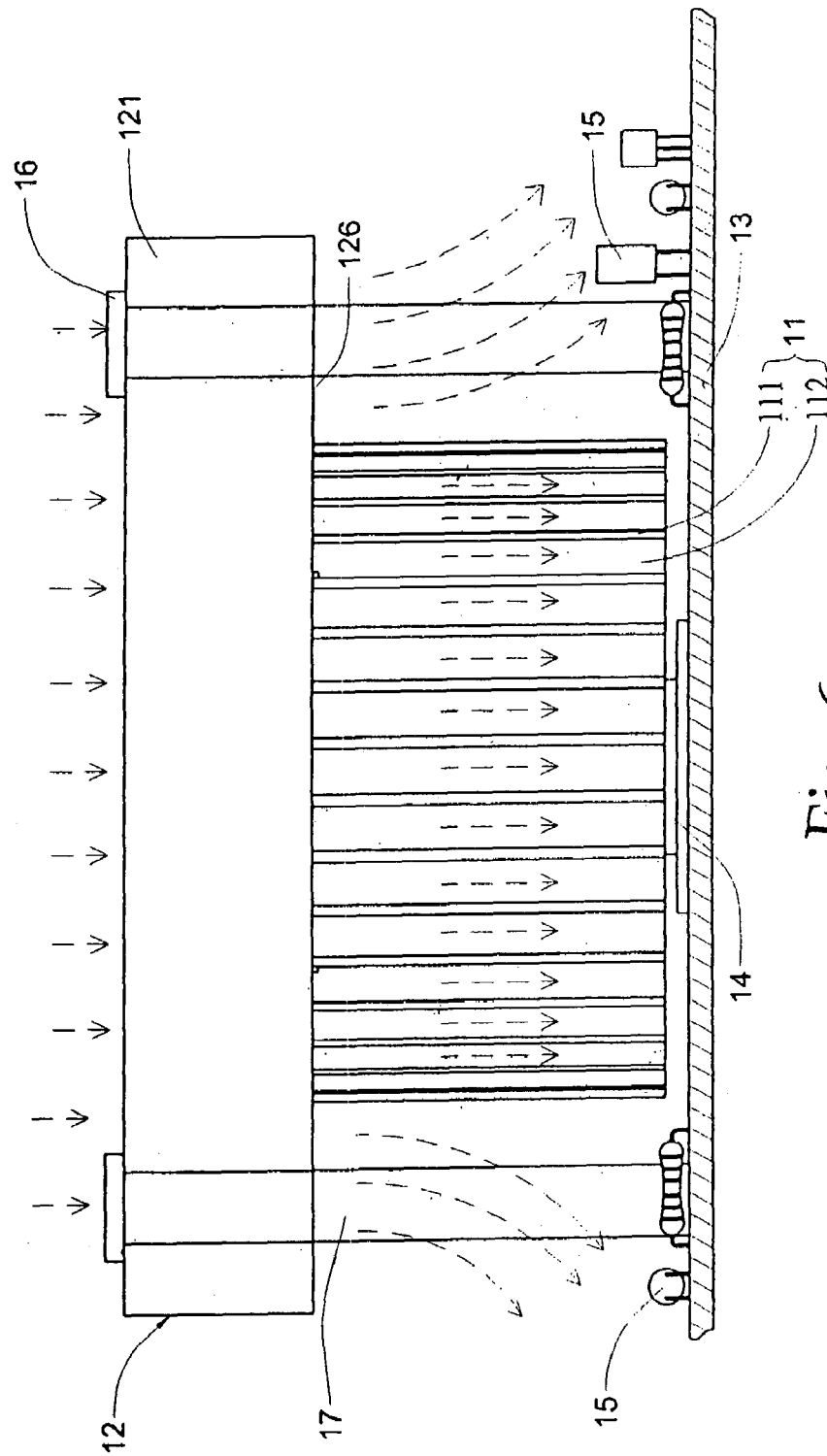
FIG. 6 is a side cross-sectional view of the cooling mechanism in FIG. 5 mounted on a base.

Referring to FIGS. 5 and 6, the second preferred embodiment of the present invention as a cooling mechanism has a fan 12 directly connected to the base 13 instead of the attachment face A of the heat conductive unit 11. The fan bracket 121 is connected to a plurality of supporting members 17 extended upright from the base 13 by securing pieces 16 inserted and secured in the through holes 1211 on the fan bracket 121. The supporting members 17 are arranged in the corresponding position to the through holes 1211, and therefore the mounted fan 12 situates close to the attachment face A of the heat conductive unit 11.

Without leaving the scope of the present invention, the shape of the fan bracket 121 can be circular (as shown in FIGS. 1 to 6) or square.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A cooling mechanism, comprising:

a heat conductive unit having a plurality of heat radiating fins, a plurality of air gaps being formed among said heat radiating fins, said heat radiating fins and said air gaps defining an attachment face of circular rim; and a fan mounted on said attachment face of said heat conductive unit, said fan including a fan wheel, said fan wheel further comprising a wheel hub and a plurality of blades arranged around said wheel hub, said blades of the fan extending in a radial direction over a distance significantly exceeding said rim of said attachment face of said heat conductive unit, whereby air flow driven by said fan will pass through said air gaps of said heat conductive unit as well as a lateral outer portion of said heat conductive unit;

wherein said fan further includes a fan bracket provided with a plurality of through holes, an inner space of said fan bracket defining an air passage, a hub mount being installed at the axial center of said fan bracket for pivotally mounting said fan wheel, said hub mount being connected to an inner wall of said fan bracket through a plurality of connecting beams, and whereby a radial outer spacing will be formed between said attachment face and said air passage; and wherein said connecting beams are respectively provided with retaining pieces for enhancing the attachment of said fan on said heat conductive unit.

2. The cooling mechanism of claim 1 wherein said heat radiating fins extend in a radial direction from a longitudinal axis of said heat conductive unit.

3. The cooling mechanism of claim 1 wherein said through holes on said fan bracket are aligned with a plurality of supporting members extended upright and are for the insertion of a plurality of securing pieces.

4. The cooling mechanism of claim 1 wherein said fan bracket is of circular cross section.

5. The cooling mechanism of claim 1 wherein said fan bracket is of square cross section.

* * * * *